United States Patent
Rinner et al.

(10) Patent No.: US 10,276,306 B2
(45) Date of Patent: Apr. 30, 2019

(54) METHOD OF PRODUCING A MULTILAYER COMPONENT

(71) Applicant: EPCOS AG, Munich (DE)

(72) Inventors: Franz Rinner, Deutschlandsberg (AT); Dieter Somitsch, Gross St. Florian (AT)

(73) Assignee: EPCOS AG (DE)

( * ) Notice: Subject to any disclaimer, the term of this patent is extended or adjusted under 35 U.S.C. 154(b) by 708 days.

(21) Appl. No.: 14/404,978

(22) PCT Filed: May 22, 2013

(86) PCT No.: PCT/EP2013/060523
§ 371 (c)(1),
(2) Date: Dec. 2, 2014

(87) PCT Pub. No.: WO2013/182424
PCT Pub. Date: Dec. 12, 2013

(65) Prior Publication Data
US 2015/0130327 A1 May 14, 2015

(30) Foreign Application Priority Data
Jun. 4, 2012 (DE) .......................... 10 2012 104 830

(51) Int. Cl.
*H01G 4/30* (2006.01)
*H01L 41/293* (2013.01)
(Continued)

(52) U.S. Cl.
CPC .............. *H01G 4/30* (2013.01); *H01G 4/005* (2013.01); *H01G 4/12* (2013.01); *H01G 4/232* (2013.01);
(Continued)

(58) Field of Classification Search
CPC .......... H01G 4/005; H01G 4/12; H01G 4/232; H01G 4/248; H01G 4/30; H01G 4/306;
(Continued)

(56) References Cited

U.S. PATENT DOCUMENTS 5,053,463 A * 10/1991 Inoue ................... C09D 177/12
525/38
5,568,679 A 10/1996 Ohya et al.
(Continued)

FOREIGN PATENT DOCUMENTS

DE          101 64 354         8/2002
DE    10 2006 003 070         3/2007
(Continued)

OTHER PUBLICATIONS

Machine Translation of Japanese Patent Publication JP 61-27687, Aug. 2017.*
(Continued)

*Primary Examiner* — A. Dexter Tugbang
(74) *Attorney, Agent, or Firm* — DLA Piper LLP (US)

(57) ABSTRACT

A method of producing a fully active multilayer element including producing a fully active stack, and optionally sintering of the fully active stack or a green precursor thereof; applying outer electrodes onto sides A' and C' of the fully active stack and contacting of the uncoated inner electrodes so that the two outer electrodes electrically connect to the uncoated inner electrode layers.

10 Claims, 4 Drawing Sheets

(51) Int. Cl.
*H01G 4/232* (2006.01)
*H01L 41/047* (2006.01)
*H01G 4/005* (2006.01)
*H01G 4/12* (2006.01)
*H01G 4/248* (2006.01)
*H01L 41/083* (2006.01)
*C03C 17/02* (2006.01)
*C09D 177/12* (2006.01)

(52) U.S. Cl.
CPC ............. *H01G 4/248* (2013.01); *H01G 4/306* (2013.01); *H01L 41/0471* (2013.01); *H01L 41/0472* (2013.01); *H01L 41/083* (2013.01); *H01L 41/293* (2013.01); *C03C 17/02* (2013.01); *C09D 177/12* (2013.01); *Y10T 29/42* (2015.01); *Y10T 29/435* (2015.01)

(58) Field of Classification Search
CPC ............. H01L 41/0471; H01L 41/0472; H01L 41/083; H01L 41/293; C03C 17/02; C09D 177/12; Y10T 29/42; Y10T 29/435
See application file for complete search history.

(56) References Cited

U.S. PATENT DOCUMENTS

| | | | |
|---|---|---|---|
| 5,865,865 A * | 2/1999 | Yoshida | ............. C03C 17/02 427/109 |
| 7,065,846 B2 | 6/2006 | Schreiner et al. | |
| 2002/0149901 A1 | 10/2002 | Shindo et al. | |
| 2006/0067029 A1 | 3/2006 | Kuniyasu | |
| 2007/0094856 A1 | 5/2007 | Miyoshi | |
| 2011/0168806 A1* | 7/2011 | Nakamura | .......... H01L 41/0472 239/102.2 |
| 2013/0201601 A1* | 8/2013 | Nishisaka | ............. H01G 4/306 361/301.4 |

FOREIGN PATENT DOCUMENTS

| | | |
|---|---|---|
| DE | 10 2007 004 813 | 8/2008 |
| EP | 1 835 553 | 9/2007 |
| JP | 61-27687 | 2/1986 |
| JP | 3-174783 | 7/1991 |
| JP | 05-291642 | 11/1993 |
| JP | 6-291386 | 10/1994 |
| JP | 10-226069 | 8/1998 |
| JP | 2001-121711 | 5/2001 |
| JP | 2004-047794 | 2/2004 |
| JP | 2005-72370 | 3/2005 |
| JP | 2005-507510 | 3/2005 |
| JP | 2005-183478 | 7/2005 |
| JP | 2011213580 A * | 10/2011 |

OTHER PUBLICATIONS

"Photoresist," printout from Wikipedia (the free encyclopedia) in English and German, 9 pages, last modified Oct. 15, 2014.
"Powder Coating," printout from Wikipedia (the free encyclopedia) in English and German, 21 pages, last modified Oct. 22, 2014.

* cited by examiner

METHOD OF PRODUCING A MULTILAYER COMPONENT

TECHNICAL FIELD

This disclosure relates to a fully active multilayer component, to a method of producing a fully active stack and to a method of producing a fully active multilayer component from the fully active stack.

BACKGROUND

Multilayer components are, inter alia, capacitors and piezo actuators, which respectively contain alternating dielectric layers and inner electrodes. In piezo actuators, the dielectric layers are furthermore piezoelectric. Piezo actuators are therefore piezo elements.

Piezo elements are used inter alia in positioning elements, ultrasound transducers, sensors and in inkjet printers, as well as in automobile technology such as driving fuel injection devices. The mode of action of a piezo element is based on deformation of piezoceramic materials, for example, lead zirconate titanate, under the effect of an electric field. When an electric voltage is applied to the piezo element, it expands in a direction perpendicular to the generated electric field (inverse piezo effect).

Advantages of piezo elements are, inter alia, their relatively high speed, relatively high efficiency and, when used as a piezo actuator, relatively short travel.

If a relatively long travel is intended to be achieved with the piezo actuator, however, then a piezo stack of a plurality of alternately successive piezoelectric layers and inner electrode layers is used for the piezo actuator, as disclosed, for example, in JP 03-174783 A.

The piezo actuator disclosed in JP 03-174783 A is configured such that the inner electrode layers electrically connect alternately to outer electrodes arranged on mutually opposite outer surfaces of the piezo stack. The inner electrode layers, which electrically connect to one of the two outer electrodes, are therefore continued as far as the outer side on which this outer electrode is arranged, for electrical connection to the outer electrode. So that the inner electrode layers are electrically insulated from the other outer electrode, however, the inner electrode layers do not reach as far as the outer side of the piezo stack, on which the further outer electrode is arranged. In these regions, the inner electrode layers are set back from the outer side. This is achieved by providing the piezo stack with silicone resin-filled slots in these regions.

Due to the set-back inner electrode layers, there are so-called "inactive zones" in piezoelectric layers assigned to these regions. Usually, the inactive zones are produced during the layer-wise production of the piezo stack. Tolerances for the processes of stacking, separation, debinding and grinding during the production of the piezo stack with inactive zones, and the requirement of reliable electrical insulation of the inner electrode layers from the corresponding outer electrode, lead to relatively large inactive zones, typically 10 percent of the piezo stack cross section. The inactive zones, through which there is a reduced electric field strength when an electric voltage is applied to the outer electrode or inner electrode layers, and which therefore expand less strongly than the other, active zones when an electric voltage is applied. This leads to mechanical stresses, particularly in the inactive zones and the edge regions joining with the inactive zones, and can lead to so-called "poling cracks" in the inactive and active zones of the piezoelectric layers, as well as in the outer electrodes. The risk of poling cracks is commensurately greater when the inactive zones are larger.

It could therefore be helpful to provide a multilayer component and a method for its production, with which the performance during operation is improved, in particular, to provide a piezo actuator with which the mechanical stresses in the piezoceramic during operation of the piezo actuator are substantially reduced.

SUMMARY

We provide a method of producing a fully active stack or a green precursor thereof including providing a sintered or unsintered stack with sides A, B, C and D respectively extending in a stack direction, made of a plurality of alternately successive ceramic dielectric layers and inner electrode layers, wherein the inner electrode layers are formed respectively continuously with respect to sides A and C and respectively not continuously with respect to either side B or side D; combining and temporarily contacting the inner electrodes or the unsintered precursors thereof, and contacting the respective side on one of sides B and D via an outer contact with temporary isozones; electrically driving the inner electrodes driveable via side B and coating of at least the electrically driven inner electrodes, or the unsintered precursors thereof, on side A with a coating material and curing, melting and optionally developing the coating material; electrically driving the inner electrodes driveable via side D and coating at least the electrically driven inner electrodes, or the unsintered precursors thereof, on side C with a coating material and curing, melting and optionally developing the coating material; applying a burn-in paste on sides A and C, debinding and burning the burn-in paste, and removing the coating material; and separating the stack to form at least one fully active stack, or a green precursor thereof, with the coated inner electrodes, or the unsintered precursors thereof, on sides A' and C'.

We also provide a method of producing a fully active multilayer element including producing a fully active stack, and optionally sintering of the fully active stack or a green precursor thereof; applying outer electrodes onto sides A' and C' of the fully active stack and contacting of the uncoated inner electrodes so that the two outer electrodes electrically connect to the uncoated inner electrode layers.

We further provide a fully active multilayer component including a fully active stack of a plurality of dielectric layers and inner electrode layers and two outer electrodes arranged on opposite sides of the stack, wherein at least a part of the inner electrode layers is coated with a burn-in paste, and the two outer electrodes respectively electrically connect to the uncoated inner electrodes.

We also provide an actuator including the fully active multilayer component mentioned above. We still further provide a capacitor including the fully active multilayer component mentioned above

BRIEF DESCRIPTION OF THE DRAWINGS

Examples of our components and methods are represented in the appended schematic drawings, in which:

FIG. 5 shows the piezo stack of FIG. 4 after application of a burn-in paste without a metal component after drying and burning in.

LIST OF REFERENCES

Figure 1:
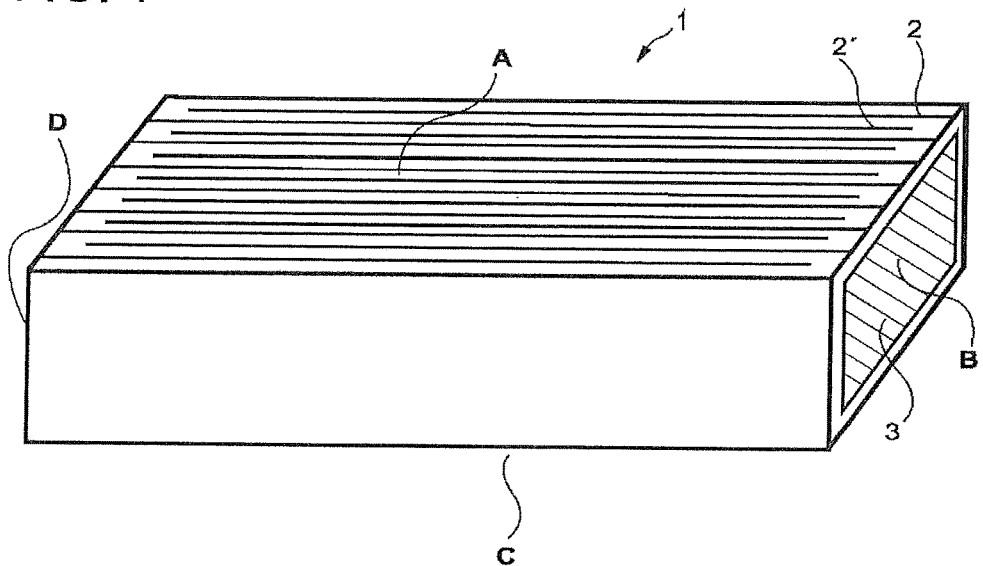
FIG. 1 shows a perspective side view of a piezo stack having the sides A, B, C and D along the stack direction.

A, B, C, D sides of the piezo stack in the stack direction
1 piezo stack
2, 2' inner electrodes
3 outer contact with temporary isozones
4 uncured photoresist layer
5 mating electrode
6 light
7 electrostatically applied and melted powder coating material
8 cured photoresist after development (i.e. dissolving or burning of the non-cured regions)
9 burn-in paste without metal component after application, debinding and burning in
10 metallization paste after application, drying and burning in
11 individual actuators with the sides A', B', C' and D'

DETAILED DESCRIPTION

We provide a method of producing a fully active stack or pile, or a green precursor thereof, comprising:
  provision of a sintered or unsintered stack with the sides A, B, C and D respectively extending in the stack direction, made of a plurality of alternately successive ceramic dielectric layers and inner electrode layers, wherein the inner electrode layers are formed respectively continuously with respect to sides A and C and respectively not continuously with respect to either side B or side D, so that one part of the inner electrodes or their unsintered precursors contacts side B, but not side D, and another part of the inner electrodes or their unsintered precursors contacts side D, but not side B;
  combination and temporary contacting of the inner electrodes, or the unsintered precursors thereof, contacting the respective side on one of sides B and D via an outer contact with temporary isozones, so that the inner electrodes contacting the respective side can be electrically driven selectively;
  electrical driving of the inner electrodes driveable via side B and coating of at least the electrically driven inner electrodes, or the unsintered precursors thereof, on side A with a coating material and curing, melting and optionally development of the coating material, so that after the development or melting the inner electrodes electrically driveable via side B are covered with coating material on side A;
  electrical driving of the inner electrodes driveable via side D and coating of at least the electrically driven inner electrodes, or the unsintered precursors thereof, on side C with a coating material and curing, melting and optionally development of the coating material, so that after the development or melting the inner electrodes electrically driveable via side D are covered with coating material on side C;
  application of a burn-in paste on sides A and C, and debinding and burning of the burn-in paste, the coating material being removed;
  separation of the stack to form at least one fully active stack, or a green precursor thereof, with the coated inner electrodes, or the unsintered precursors thereof, on sides A' and C'. If a fully active piezo stack is intended to be produced by the method, ceramic piezoelectric layers are used for the ceramic dielectric layers. Preferably, the starting (stack) comprises regions in which the inner electrode layers respectively contact sides B and D alternately. Particularly preferably, all the inner electrode layers respectively contact sides B and D alternately in the starting (stack). A fully active stack means a stack in which the inner electrodes are continuous, i.e. they extend over the entire cross-sectional area of the stack. By virtue of this configuration, all of the inner electrodes reach as far as the outer side of the stack, for which reason the latter does not comprise inactive zones. In this way, the performance of the multilayer component is improved by operation and, in the piezo actuator, the level of the mechanical stresses in the piezoceramic during operation is reduced.

The (starting) stack provided in the method of producing a fully active stack is, for example, produced by alternate stacking of at least two substacks, each of the substacks comprising a dielectric layer and an inner electrode layer arranged thereon. The stack provided is in this case produced, in particular, by printing on green ceramic sheets with metallic pastes, for example, by the screen printing method. Printing is conducted such that the metallic pastes fully cover the ceramic green sheet, an unprinted border being left on one side. The metallic pastes comprise, for example, AgPd or Cu particles, solvent and further additives. Typically about 300 to 600 green ceramic sheets provided with the paste of the two substacks are then placed above one another to form a block in which the metallic intermediate layers alternately contact two opposite sides and every second intermediate layer is oriented in the same way with respect to the unprinted border. The resulting stack is then processed by pressing to form a green block. The green block is then debinded to remove organic constituents (in particular binder) and optionally sintered. Optionally, a plurality of (starting) stacks or piles may be produced from a green block by separation into individual stacks.

The ceramic dielectric layers may comprise a piezoelectric material, for example, lead zirconate titanate (PZT).

In the method of producing a fully active stack, or its green precursor, the (starting) stack provided in the first step may be either sintered or green.

Preferably, a photoresist and/or a powder coating material and/or a current-structurable functional coating material (referred to below as a "functional coating material" for brevity) is used as the coating material.

Photoresists are known in the art of photolithographic structuring. They are used particularly in microelectronics and microsystem technology for production of structures in the micrometer and submicrometer ranges, as well as in printed circuit board production. The most important starting substances for photoresists are polymers (for example polymethyl methacrylate, polymethyl glutarimide) or epoxy resins (for example SU-8), solvents such as cyclopentanone or gamma-butyrolactone, as well as a photosensitive component. Negative resists and positive resists are known. The negative resist polymerizes by exposure to light and/or curing, that is to say after the development (removal of the non-polymerized regions by solvent) the exposed and/or cured regions remain. In positive resists, the already solidified resist becomes soluble again for corresponding developer solutions by exposure to light, that is to say after the development only the regions which are protected against the irradiation by a mask, and are therefore not exposed, remain. Both positive and negative resists may be used.

Powder coating materials are organic, usually thermosetting coating powders with a solids content of 100%. In contrast to all other coating technologies, coating with powder coating materials does not require solvent. For production of the powder coating materials, processing methods such as extrusion and grinding are used. Powder coating materials consist of binders, additives, colorants and fillers. The absence of solvents is characteristic of powder coating materials. The chemical differences between the raw materials used in powder coating materials and conventional coating materials are not great. The crosslinking mechanisms of the powder coating material film are similar to those of a burn-in coating material, in which two reaction partners form a chemical compound by forming an organic network under the effect of heat.

The term functional coating materials means coating materials whose crosslinking and curing takes place by prior local electrical driving (flow of electric current). These functional coating materials are selected from the group consisting of coating materials as used in electron beam lithography (for example, PMMA), coating materials with thermal curing carried out by electric current application, coating materials crosslinking indirectly by means of current (for example, mixtures of electroluminescent polymers with photosensitive substances), and mixtures thereof. The functional coating materials may be coating materials as used in electron beam lithography (for example, PMMA). These are also termed electron beam resists. The mechanism of the "exposure" of electron beam resists with high-energy electrons is used for structuring in electron beam lithography. In analogy, with the photoresist, the chemical modification takes place by local electron flow. To generate the electronic kinetic energy necessary for the "exposure" of the coating material (electric current application to the coating material) with electrons, the coating material preferably has a high irradiation sensitivity and a conductivity which is sufficiently great that charges can be transported and electrostatic charging of the coating material is avoided. The electrical driving is preferably carried out by pulsed high voltage. Particularly preferably, a gap with a size of a few µm from the coating material is maintained on the side of the cathode (electron emitter). The electrons emerging by field emission from the cathode are accelerated across this gap and then strike the coating material with higher energy. The cathode/coating material gap may be produced either on the side of the coating material surface facing away from the dielectric layer to the outer electrode or between (set-back) inner electrodes and applied coating material.

The functional coating materials may be coating materials based on thermal curing by electric current application. In these functional coating materials, the kinetic energy of the electrons is converted into thermal energy, which causes local curing of the coating material. To this end, the coating material has a suitable conductivity, which is high enough to prevent electrostatic charging of the coating material during the electric current application. To limit the thermal curing effect locally to the region of the driven electrodes, the thermal conduction is preferably counteracted, i.e. the driving is preferably carried out by short high-voltage pulses.

The functional coating materials may be coating materials which can be crosslinked indirectly by electric current. These functional coating materials comprise, for example, a combination of an electroluminescent coating material (containing an electroluminescent polymer) with a photoresist (containing photosensitive components). When suitable metallic contacts are used, an action mechanism as in an OLED (organic light-emitting diode) is established. In this configuration, the electroluminescent polymer through which the current flows, and which is contained in the electroluminescent coating material, fulfills the function of local exposure of the photoresist, which contains the photosensitive components.

The aforementioned functional coating materials may be configured as positive or negative coating materials. In negative coating materials, the regions above the electrically driven inner electrodes remain after the curing and development (removal of the non-polymerized regions of the coating material by solvent), while the other regions are dissolved during the development. When a positive coating material is used, the situation is the reverse.

A glass paste may, for example, be used as burn-in paste. During the debinding, the binder is then also removed from the glass paste. The thickness of the burnt-in glass is preferably 20 µm to 80 µm.

To expose or cure the current-structurable functional coating material, a mating electrode may be positioned on the functional coating material and a voltage, preferably pulsed high voltage, is applied. The crosslinking, or curing, takes place by the evolution of heat associated with the current, or chemical modification (as described above) of the coating material. A thick-film coating material (typically 50 µm thick) based on PMMA (polymethyl methacrylate) may, for example, be used as functional coating material. The current-curing functional coating material may be mixed with further components to establish a defined resistance. If the functional coating material used is a so-called "negative resist," the regions above the electrically driven inner electrodes remain after the curing and development (removal of the non-polymerized region of the functional coating material by solvent), while the other regions are dissolved during the development. The situation is the reverse when a positive coating material is used.

Powder coating material may be used instead of functional coating material. To this end, the powder coating material is applied electrostatically onto the electrically driven inner electrodes and melted.

The powder coating material may be used in addition to the photoresist. In this case, the powder coating material is applied electrostatically onto a layer of photoresist, the powder coating material being attracted by the electrically driven inner electrodes. The melted powder coating material can then be used as a mask, and the photoresist can be normally exposed. If a negative resist is used as the photoresist, the regions of the photoresist above the inner electrodes not electrically driven remain after the curing and development (removal of the non-polymerized regions of the photoresist by solvent), while the other regions are dissolved during the development. The situation is the reverse when a positive resist is used.

The photoresists or the current-curing functional coating materials may be provided with a glass component. In this way, a glass paste that can be structured with light or electric current is obtained, which can be used for direct insulation of the electrodes driven via the outer contacts on sides B and D.

A method of producing a fully active multilayer element is provided. In detail, the method comprises production of a fully active stack, as described above, and optionally sintering of the fully active stack or a green precursor thereof; and application of outer electrodes onto sides A' and C' of the fully active stack and contacting of the uncoated inner electrodes, so that the two outer electrodes are electrically connected to the uncoated inner electrode layers.

A fully active multilayer element is provided. In detail, the fully active multilayer element comprises a fully active stack of a plurality of dielectric layers and inner electrode layers and two outer electrodes arranged on opposite sides of the stack, wherein at least a part of the inner electrode layers is coated with a burn-in paste, and wherein the two outer electrodes are respectively electrically connected to the uncoated inner electrodes. The multilayer element may, for example, be configured as an actuator or capacitor.

Figure 2:
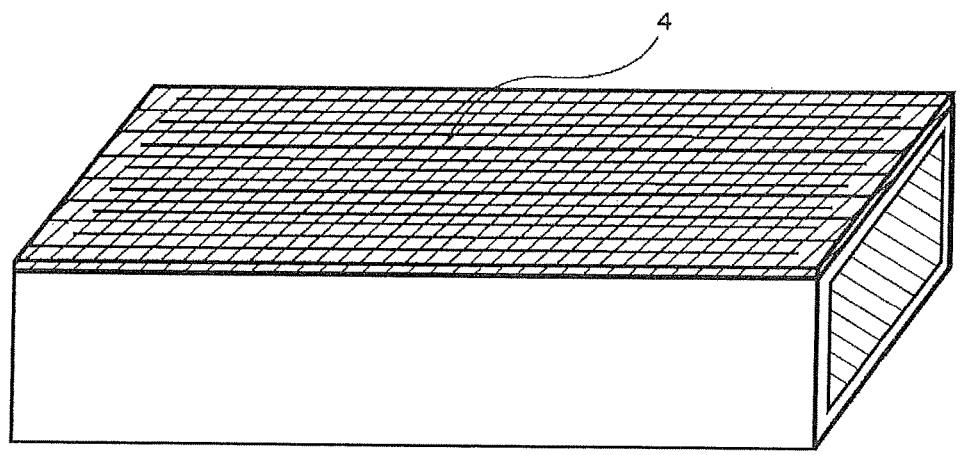
FIG. 2 shows a piezo stack having a layer of functional coating material over side A.
Figure 3A:
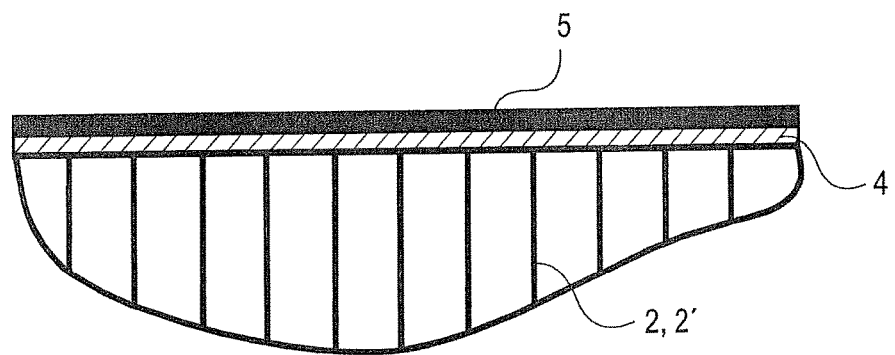
FIG. 3a shows the piezo stack of FIG. 2 in cross section with an electrode plate applied.
Figure 3B:
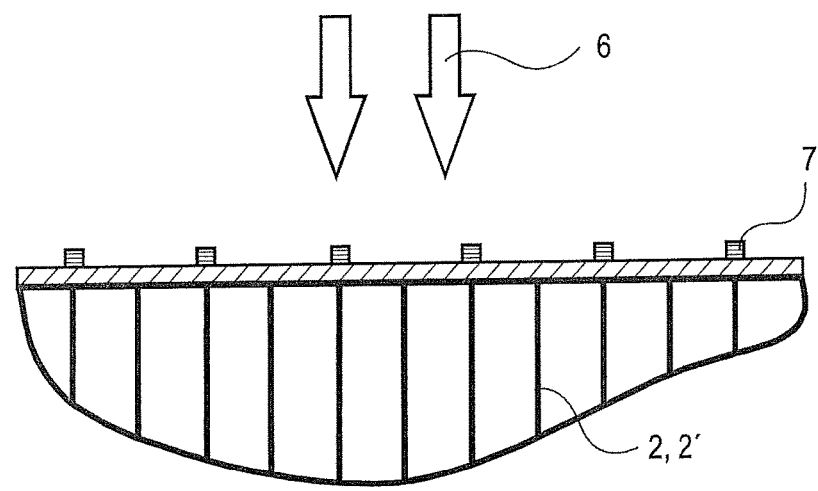
FIG. 3b shows an alternative embodiment to FIG. 3a with a powder coating material electrostatically coated onto a photoresist layer and melted, and subsequent exposure to light.
Figure 4:
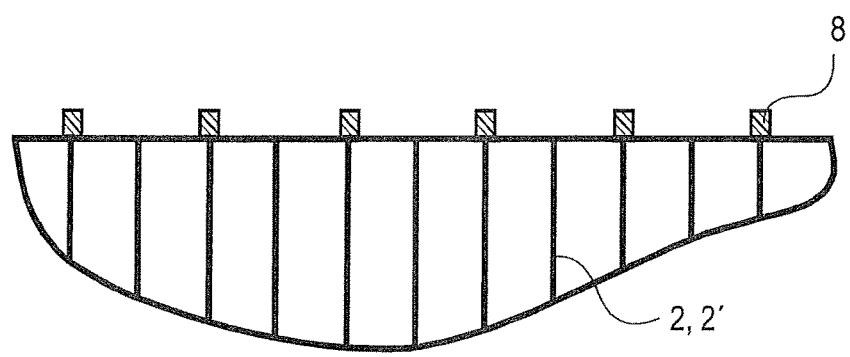
FIG. 4 shows the photoresist layer, or functional coating material layer, cured according to one of FIGS. 3a and 3b, after development.
Figure 5:
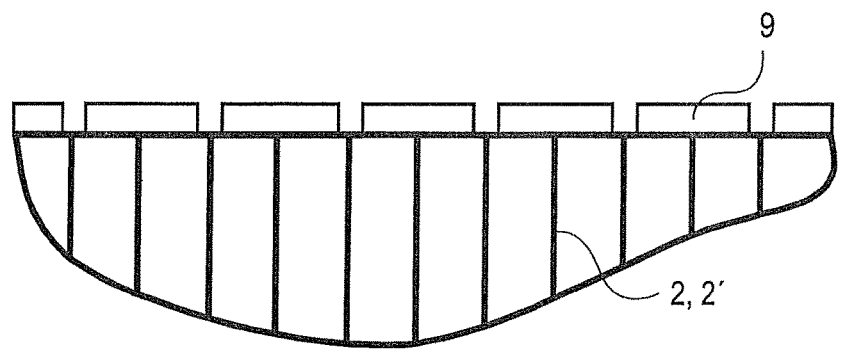
Figure 6:
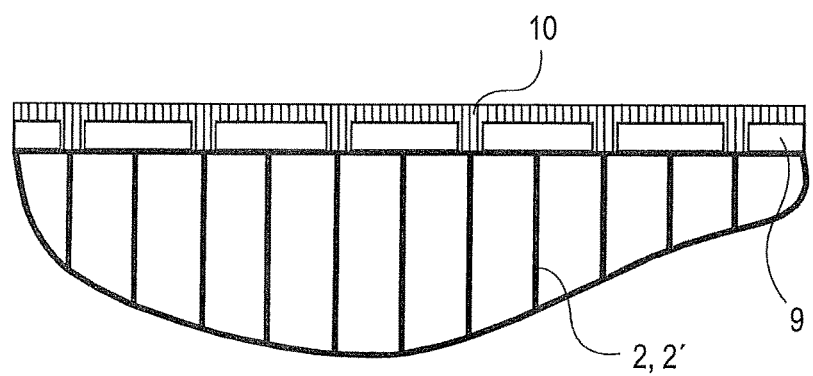
FIG. 6 shows the piezo stack of FIG. 5 after application of a metallization paste.
Figure 7:
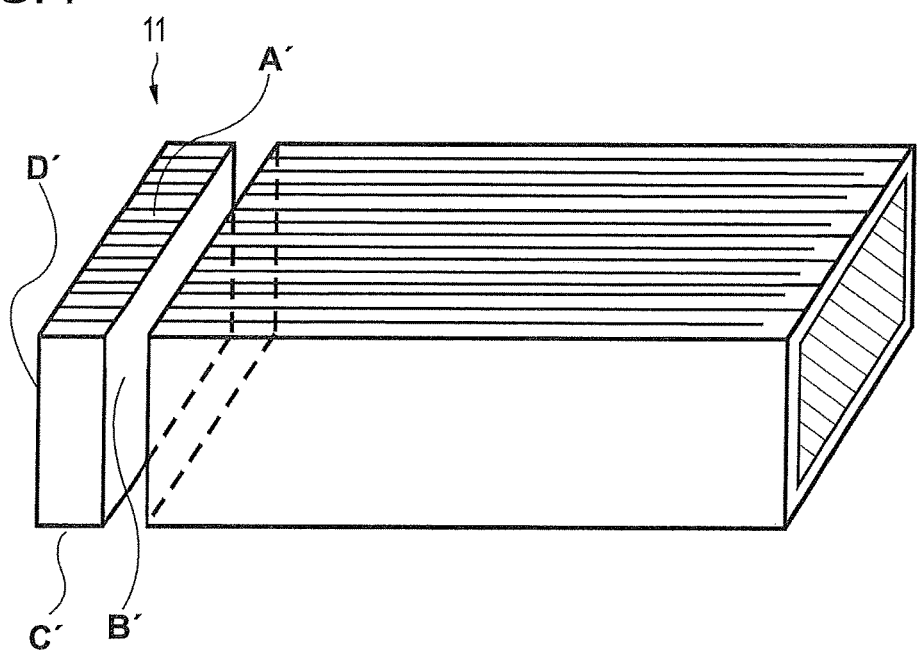
FIG. 7 shows a separated, fully active piezo stack having the sides A', B', C' and D' along the stack direction.

In one example, the process sequence is as follows:

a) A sintered piezo stack (1) having the sides A, B, C and D along the stack direction is provided. The piezo stack has (temporary) isozones and outer contacts (3), so that every second inner electrode (2) on side B can be electrically driven via the outer contact (3), and every second inner electrode (2') can be electrically driven by the corresponding outer contact (3', not shown) on side D (cf. FIG. 1).

b) The piezo stack (1) is provided on side A with a layer of the functional coating material (4), in this example a negative resist, (cf. FIG. 2). For example, a PMMA thick-film coating material, typically 50 μm, the resistance of which has been suitably adjusted by additional components, is used.

c) An electrode (5) is placed on the functional coating material layer (4). A pulsed high voltage is then applied to the outer contact (3) on side B and the electrode (5), so that the region above every second inner electrode (2) is cured by the input of heat. As an alternative, powder coating material may be applied onto the one photoresist layer above the electrically driven inner electrode (2), by charging the powder coating particles with the opposite polarity. The powder coating material is then melted and used as a mask for the exposure to light (6).

d) FIG. 4 shows the cured photoresist or functional coating material (8) after development, i.e. dissolving of constituents which are not cured or polymerized.

e) In FIG. 5, a burn-in paste without a metal component (9) was applied, debinded and burned in. The rest of the powder coating material was burned, and therefore removed, during the debinding.

f) FIG. 6 shows the piezo stack of FIG. 5 after the application, drying and burning in of the metallization paste for the outer contacts.

g) FIG. 7 shows the separation of the fully active piezo stack into individual actuators with the sides A', B', C' and D'. The application of the metallization paste (10), as explained with the aid of FIG. 6, may take place before or after the separation into individual actuators (11).

The invention claimed is:

1. A method of producing a fully active stack or a green precursor of the fully active stack comprising:

providing a sintered or unsintered stack with sides A, B, C and D respectively extending in a stack direction, made of a plurality of alternately successive ceramic dielectric layers and inner electrode layers, wherein the inner electrode layers are formed respectively continuously with respect to the sides A and C and respectively not continuously with respect to either the side B or the side D;

combining and temporarily contacting the inner electrodes or the unsintered precursors of the inner electrodes, and contacting the respective side on one of sides B and D via an outer contact with temporary isozones;

electrically driving the inner electrodes driveable via the side B and coating at least the electrically driven inner electrodes, or the unsintered precursors of the inner electrodes, on the side A with an organic powder coating material with a solids content of 100%, and curing or melting the organic powder coating material;

electrically driving the inner electrodes driveable via the side D and coating at least the electrically driven inner electrodes, or the unsintered precursors of the inner electrodes, on the side C with the organic powder coating material and curing or melting the organic powder coating material;

applying a burn-in paste on the sides A and C, debinding and burning the burn-in paste, and removing the organic powder coating material; and separating the stack to form at least one fully active stack, or a green precursor of the fully active stack, with the coated inner electrodes, or the unsintered precursors of the inner electrodes, on sides A' and C' that are formed from the sides A and C, respectively, after separating the stack, the sides A' and C' having the same orientation as the sides A and C, respectively.

2. The method according to claim 1, wherein the organic powder coating material is a combination of a photoresist and an electroluminescent coating material.

3. The method according to claim 1, wherein, in order to cure the organic powder coating material, a mating electrode is placed on the sides A and C, and the functional coating material is cured or crosslinked by electric current-induced input of heat when a voltage is applied.

4. The method according to claim 1, wherein a gap is provided between the inner electrode layers and the organic powder coating material or between a coating material surface and a mating electrode.

5. The method according to claim 1, wherein the organic powder coating material is electrostatically applied onto the electrically driven inner electrodes and melted.

6. The method according to claim 5, wherein the organic powder coating material is applied onto a layer of photoresist.

7. The method according to claim 1, wherein the organic powder coating material is a photoresist that is cured by exposure to light.

8. The method according to claim 1, wherein the plurality of ceramic dielectric layers are piezoelectric layers.

9. The method according to claim 1, further comprising developing the organic powder coating material on at least one of the sides A and C.

10. The method according to claim 1, wherein a photoresist is the organic powder coating material.

* * * * *